United States Patent
Ito

(10) Patent No.: US 8,314,787 B2
(45) Date of Patent: Nov. 20, 2012

(54) DISPLAY DEVICE

(75) Inventor: Yukihiro Ito, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 904 days.

(21) Appl. No.: 12/344,950

(22) Filed: Dec. 29, 2008

(65) Prior Publication Data

US 2009/0167731 A1 Jul. 2, 2009

(30) Foreign Application Priority Data

Dec. 26, 2007 (JP) ................................. 2007-334779

(51) Int. Cl.
*G09G 5/00* (2006.01)
(52) U.S. Cl. .......................... 345/206; 349/150; 361/748
(58) Field of Classification Search .......... 345/204–206, 345/87; 349/149–151; 361/748, 760, 767
See application file for complete search history.

(56) References Cited

FOREIGN PATENT DOCUMENTS

| JP | 3-125334 | 12/1991 |
|---|---|---|
| JP | 2001-320010 | 11/2001 |
| JP | 2003-149666 | 5/2003 |
| JP | 2007-025710 | 2/2007 |

*Primary Examiner* — Regina Liang
(74) *Attorney, Agent, or Firm* — Young & Thompson

(57) ABSTRACT

Driver IC 1 including a built-in charge pump power supply is mounted on display panel 5. Among wirings connected to driver IC 1, the width of FPC mounting pad 4 of connection wiring 3 leading to a driver built-in power supply is widened as compared with pads 4 of other wirings 2. In addition, a portion of terminal intervals of a terminal array of FPC mounting pad 4 is widened as compared with other terminal intervals so that a wiring path from pad 4 to driver IC 1 is reduced. Similar terminal widths and terminal intervals are adopted for terminal 6 on the side of flexible substrate 7 electrically connected to FPC mounting pad 4 by pressure bonding.

11 Claims, 5 Drawing Sheets

WITHOUT SLIT
(WINDOW APERTURE)

WITH SLIT
(WINDOW APERTURE)

DISPLAY DEVICE

This application is based upon and claims the benefit of priority from Japanese Patent Application No. 2007-334779 filed on Dec. 26, 2007, the content of which is incorporated by reference.

BACKGROUND OF THE INVENTION

1. Field of the Invention

The present invention relates to a display device, and more particularly, to a display device including a driver IC (Integrated Circuit) with a built-in charge pump DC/DC (direct current/direct current) converter.

2. Description of the Related Art

A display device uses a structure in which a glass substrate, a driver IC, and a flexible substrate are joined by thermal pressure bonding method (hereunder, refers to pressure bonding). An example of such a display device is shown in FIGS. 1 and 2. FIG. 1 is a diagram showing the junction of a display panel and a flexible substrate in a conventional display device. In addition, FIG. 2 is a cross-sectional diagram taken along line B-B of FIG. 1.

As shown in FIG. 1, driver IC 101 is mounted on display panel 5. Driver IC 101 is electrically connected to wiring 2 formed on display panel 5 and to connection wiring 3 leading to a driver built-in power supply. In addition, a plurality of FPC (Flexible Printed Circuit) mounting pads 104 is formed on display panel 5. FPC mounting pads 104 are respectively electrically connected to wiring 2 and to connection wiring 3 leading to the driver built-in power supply.

Meanwhile, a plurality of terminals 106 is formed on FPC 7. As for terminals 106 and FPC mounting pads 104 on the side of display panel 5, for example, terminals 106 on both ends are respectively electrically connected by pressure bonding to FPC mounting pads 104 shown by the arrows shown in FIG. 1.

In addition, as shown in FIG. 2, driver IC 101 and FPC 7 are respectively joined to display panel 5 by pressure bonding. Furthermore, bump 10 is formed on driver IC 101. Moreover, ITO (Indium Tin Oxide) film 8 that is a transparent conductive film for preventing oxidation of terminal surfaces is formed on wiring 3. When mounting driver IC 101, driver IC 101 and wiring 3 are electrically connected to each other by performing pressure bonding with anisotropically conductive tape 9 lied between bump 10 and ITO film 8. In a similar manner, terminals 106 on the side of FPC 7 and FPC mounting pads 104 on the side of display panel 5 are electrically connected to each other by performing pressure bonding with anisotropically conductive tape 9 lied between terminals 106 and FPC mounting pads 104.

Meanwhile, for example, as shown in FIG. 1, the widths of the respective terminals/pads of the junction of display panel 5 and FPC 7 were conventionally set uniform due to reasons such as ease of design. In addition, wiring configurations which vary the widths of a portion of the terminals/pads among a group of terminals have been disclosed in, for example, Japanese Utility Model Laid-Open No. 3-125334 and Japanese Patent Laid-Open No. 2007-025710.

FIG. 3 is a diagram showing a junction formed by pressure bonding in a display device disclosed in Japanese Utility Model Laid-Open No. 3-125334. The pressure-bonded section shown in FIG. 3 connects display panel 5 to PWB (Printed Wiring Board) 122 by FPC 7. ITO film 8 is formed on the surfaces of wiring electrode 121a of display panel 5 and wiring electrode 121b of PWB 122. In addition electrodes 121a and 121b and a terminal of FPC 7 are electrically connected to each other by pressure bonding. Note that in FIG. 3, for simplicity, FPC 7 is abbreviated and depicted by dashed lines.

Recently, there has been an increase in display devices provided with a driver integrated circuit (hereinafter referred to as a driver IC) having a built-in charge pump type DC/DC converter. In such a display device, a charge pump in the driver IC charges the voltage from the driver IC via the wirings to a boost capacitor mounted on the FPC. In this case, if the wiring resistance increases due to difference of the wiring material on a glass substrate, the layer constitution of the mounting pads, and the like, a boost voltage loss occurs in association with a voltage drop. As a result, there is a risk that the voltage drop may cause a decline in the display quality of the display device. In the present specification, "resistance" refers to electrical resistance.

In addition, in the conventional display device shown in FIGS. 1 and 2, ITO film 8 is formed, as described above, in order to prevent oxidation of terminal surfaces. In this case, among the resistance of the entire wiring path, contact resistances between terminals and ITO film 8 formed on the surface thereof are relatively high resistance. Now, if the widths of the respective terminals of the junction are uniform as shown in FIGS. 1 and 2, a contact area of the junction is determined by the shapes of the terminals. Therefore, it is difficult to reduce wiring resistance while forming the ITO film.

In addition, in the conventional display device shown in FIGS. 1 and 2, the pitch between the respective terminals (hereinafter also referred to as a terminal interval) is uniform due to the simple design that explains why the terminal width was made uniform. However, with a uniform pitch, since positions of pads on the driver IC side differ from positions of the FPC mounting pads, a wiring path to a boost capacitor on the FPC is determined by terminal positions, resulting in a complicated wiring path. In addition, a uniform terminal pitch also results in a longer wiring path, similarly contributing to an increase in wiring resistance.

With the display device disclosed in Japanese Utility Model Laid-Open No. 3-125334 and shown in FIG. 8, the widths of terminals near both ends of a terminal array are increased easily in comparison to the widths of terminals near the center thereof. However, a wiring which a relatively large current flows, such as a driver IC power supply wiring, is not always disposed at both ends of the terminal array. Therefore, only increasing the widths of terminals near both ends of the terminal array does not necessarily contribute towards reducing in wiring resistance.

With the terminal structure disclosed in Japanese Patent Laid-Open No. 2007-025710, for example, the width of power supply wiring is increased in comparison to signal wiring and a divided terminal structure is adopted for the pressure-bonded section. However, since the pitch between the respective terminals is set approximately uniform, there is a problem in that the wiring path becomes complicated as described above.

SUMMARY OF THE INVENTION

The present invention has been in consideration of the above problems, and an object thereof is to provide a display device capable of suppressing an increase in wiring resistance including contact resistance in a wiring path including a pressure-bonded section and simplifying the wiring path.

A display device according to the present invention comprises: a glass substrate including a plurality of first terminals arranged so as to be mutually offset; a FPC including a plurality of second terminals electrically connected to the plurality of first terminals by pressure bonding; and a driver circuit electrically connected to at least a portion of the first and second terminals, wherein the driver circuit includes a built-in charge pump type direct current/direct current converter (refers to DC/DC converter), a width of a terminal electrically connected to a power supply circuit of the DC/DC converter among the first and second terminals is wider than widths of other terminal pairs, and an interval of at least one pair of adjacent terminals to the first and second terminals differs from intervals between other terminals.

In this case, the terminals electrically connected to the power supply circuit of the DC/DC converter can be arranged having widths such that a contact resistance of a pressure-bonded section is equal to or lower than a predetermined value.

In addition, either one of or both the terminals can be arranged so that a transparent conductive film is formed on a pressure-bonded surface of each terminal.

Furthermore, a pressure-bonded surface of one or a plurality of terminals among the first and second terminals can be arranged so that a slit or a window aperture is formed thereon.

The above and other objects, features, and advantages of the present invention will become apparent from the following description with reference to the accompanying drawings, which illustrate examples of the present invention.

BRIEF DESCRIPTION OF THE DRAWINGS

FIG. 8b is a cross-sectional diagram taken along line C-C of FIG. 8a;

DETAILED DESCRIPTION OF THE PREFERRED EMBODIMENTS

In the present invention, in a terminal region of a pressure-bonded section that is under dimensional constraints, the terminal region can be effectively utilized and the contact resistance of wiring can be reduced by widening the width of a terminal connected to a power supply circuit of a built-in charge pump type DC/DC converter. In addition, a wiring path from a driver IC to a FPC can be simplified by widening a portion of terminal intervals among a terminal array in comparison to other terminal intervals. Furthermore, wiring resistance can also be reduced by minimizing the wiring path.

Exemplary embodiments will now be described in detail with reference to the attached drawings.

Figure 4:
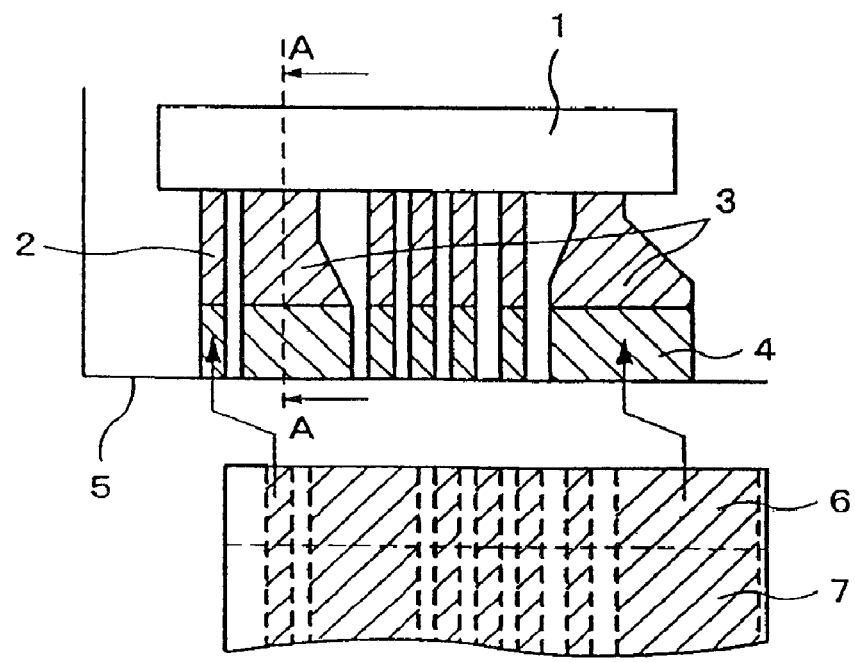
FIG. 4 is a plan view showing a display device according to a first exemplary embodiment.
Figure 5:
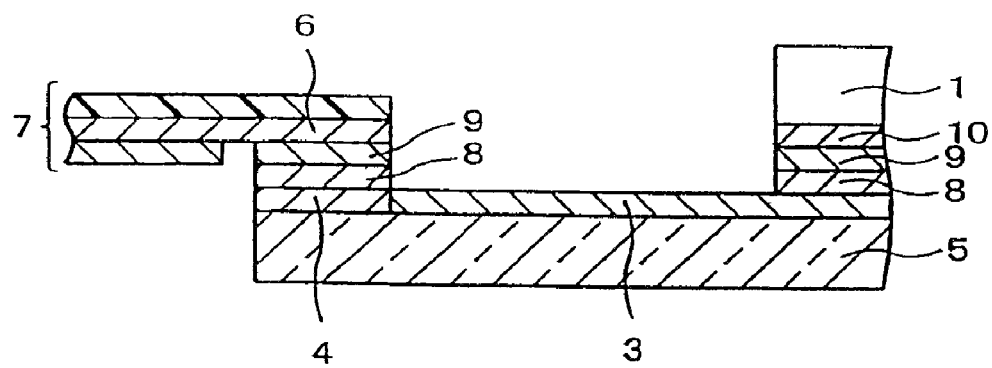
FIG. 5 is a cross-sectional diagram taken along line A-A of FIG. 4.

To begin with, a first exemplary embodiment will be described. FIG. 4 is a plan view showing a terminal pressure-bonded section of a display device according to the present first exemplary embodiment. In addition, FIG. 5 is a cross-sectional diagram taken along line A-A of FIG. 4. Note that, in FIG. 4, for simplicity, display panel 5 and flexible substrate 7 are depicted as being separated from each other.

As shown in FIG. 4, driver IC 1 is mounted on display panel 5 and includes a built-in charge pump. Display panel 5 is made up of a glass substrate. In addition, wiring 2 and connection wiring 3 leading to the driver built-in power supply, which are respectively electrically connected to driver IC 1, are formed on display panel 5. FPC mounting pad 4 is formed on display panel 5 and is respectively electrically connected to wiring 2 and connection wiring 3 leading to the driver built-in power supply. Wiring 2 and connection wiring 3 leading to the driver built-in power supply are formed so that the width thereof on the side of FPC mounting pad 4 is equal to or wider than the width thereof at the connection with driver IC 1. The width of each terminal of FPC mounting pad 4 is equal to wiring 2 and to connection wiring 3 leading to the driver built-in power supply. In other words, the terminal width of FPC mounting pad 4 connected to connection wiring 3 leading to the driver built-in power supply is wider than, for example, the terminal width of FPC mounting pad 4 connected to wiring 2 for signals. In addition, the array of FPC mounting pad 4 has a non-uniform terminal pitch so as to enable the layout of corresponding terminal 6 to be as simple as possible. In other words, pad 4 is formed at a position that minimizes the wiring path from the driver IC.

Meanwhile, a plurality of terminals 6 are formed on FPC 7. As for terminals 6, for example, terminals at both ends of a terminal array are formed at positions of FPC mounting pads 4 to which the terminals are associated in one-on-one relationships indicated by the arrows (broken lines) shown in FIG. 4. In addition, at least at the connection with FPC mounting pads 4, the widths of terminals 6 are favorably equal to FPC mounting pads 4 at corresponding positions. However, the widths of the terminals on the FPC-side do not have to be consistent with the widths of the pads on the glass substrate.

Furthermore, as shown in FIG. 5, driver IC 1 and FPC 7 are respectively joined to display panel 5 by pressure bonding. In addition, bump 10 is formed on driver IC 1. Moreover, ITO film 8 for preventing oxidation of terminal surfaces is formed on wiring 2. When mounting driver IC 1, driver IC 1 and wiring 3 are electrically connected to each other by performing pressure bonding with anisotropically conductive tape 9 lied between bump 10 and ITO film 8. In a similar manner, terminals 6 on the side of flexible substrate 7 and FPC mounting pads 4 on the side of display panel 5 are electrically connected to each other by performing pressure bonding with anisotropically conductive tape 9 inserted between terminals 6 and FPC mounting pads 4.

Figure 6:
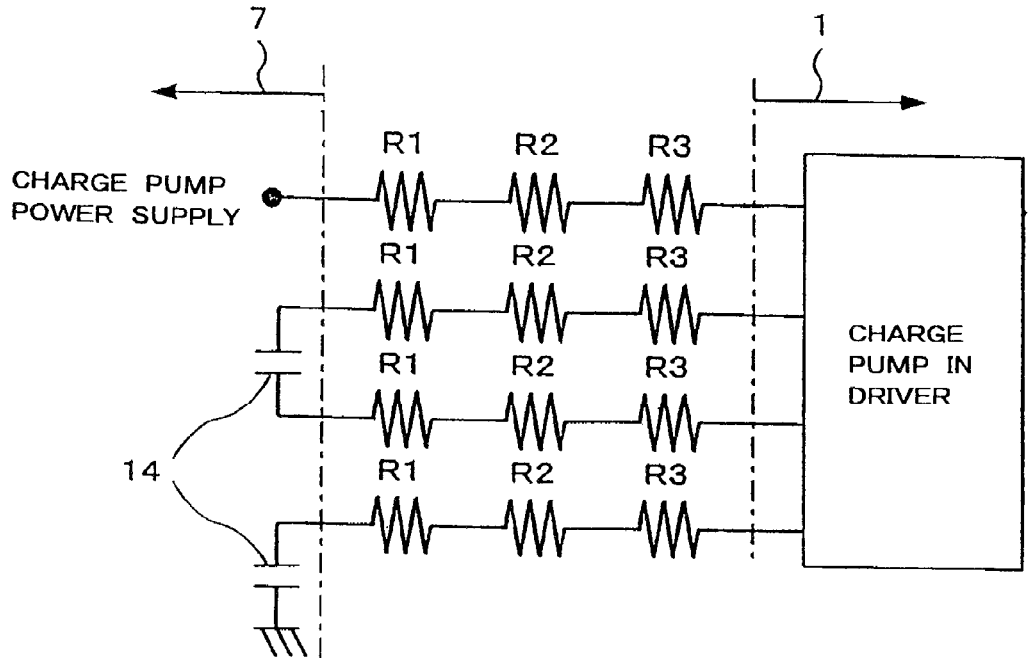
FIG. 6 is an equivalent circuit diagram showing the display device shown in FIG. 4 to include contact resistors and wiring resistors.

Next, operations of the present exemplary embodiment will be described with reference to FIG. 6. FIG. 6 is an equivalent circuit diagram of a charge pump in a display device including a driver IC, a boost capacitor and power supply.

As shown in FIG. 6, a boost capacitor for the charge pump is mounted on the side of FPC 7. The boost capacitor is connected to a charge pump in driver IC 1 via a wiring path including a contact resistance (R1) at a pressure-bonded section of FPC 7 and display panel 5, a wiring resistance (R2) on display panel 5, and a contact resistance (R3) at a pressure-bonded section of driver IC 1 and display panel 5. In addition, a charge pump power supply is supplied from the side of FPC 7 to the charge pump via a wiring path including similar resistance.

As shown in FIG. 6, respective resistors R1, R2, and R3 on the wiring path are connected in series. Therefore, contact resistance R1 at the pressure-bonded section of FPC 7 and display panel 5 also directly contribute to the resistance of the entire wiring. Furthermore, a terminal region of the pressure-bonded section as a whole is under dimensional constraints. In the present exemplary embodiment, in order to effectively utilize the terminal region of the pressure-bonded section, the widths of the respective terminals of the pressure-bonded section are varied from one another. More specifically, as described above, for example, the widths of FPC mounting pad 4 connected to connection wiring 3 in FIG. 4 is widened as compared with the widths of other pads connected to connection wirings 2. In the descriptions on the respective exemplary embodiments given below, it is assumed that a terminal region of a pressure-bonded section includes both pads on the side of the display panel (glass substrate) and terminals on the side of the FPC.

An example of a case will now be described where a total resistance value (R1+R2+R3) between the charge pump and the boost capacitor is required to be, for example, equal to or less than 10Ω. In this case, it is assumed that the contact resistor (R3) between display panel 5 and driver IC 1 has a value of 8Ω. In addition, the wiring resistance (R2) is assumed to have a value of 1Ω. Therefore, the contact resistance (R1) between the glass substrate and the FPC needs to be set to a value of 1Ω or lower. Moreover, the pad width×pad length contributing to R1 is assumed to be, for example, 0.1 mm×1 mm.

With a conventional display device, it is assumed that 2 pads can be formed at a pitch of 0.1 mm. In this case, the contact resistor (R1) of the pressure-bonded section of FPC 7 and display panel 5 take a value of 1.5Ω, resulting in a total resistance value of 10.5Ω (which does not achieve the desired resistance value. Since the terminal region of the pressure-bonded section is under dimensional constraints as described above, simply increasing the number of pads is difficult.

In the present exemplary embodiment, by widening the pad width, contact resistor R1 can be reduced while using the same terminal region as a conventional display device. In the case of the present example, the value of R1 can be set to 1Ω by widening the pad width to, for example, 0.3 mm.

As described above, with the present exemplary embodiment, in the terminal region of a pressure-bonded section which is susceptible to dimensional constraints, the width of a terminal connected to a power supply circuit is widened as compared with the width of a terminal for signals. Consequently, the terminal region can be utilized effectively and the contact resistance of the wiring can be reduced.

Figure 1:
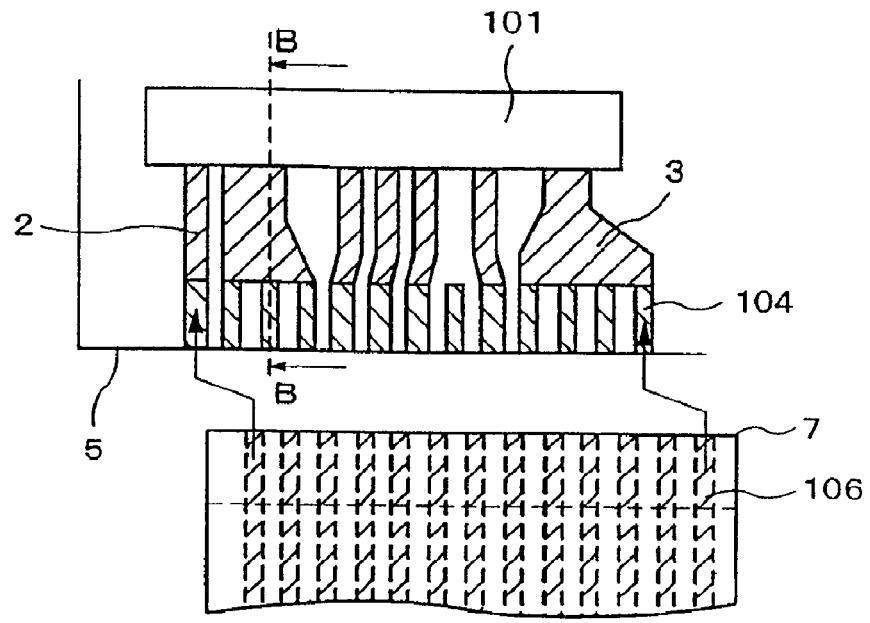
FIG. 1 is a plan view showing a conventional display device.
Figure 2:
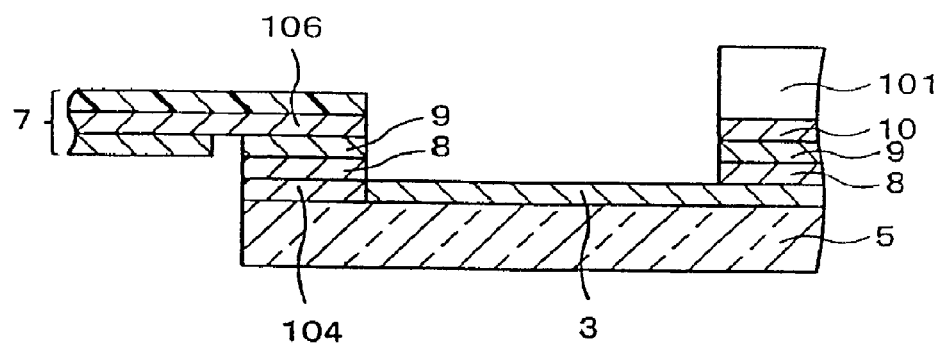
FIG. 2 is a cross-sectional diagram taken along line B-B of FIG. 1.
Figure 3:
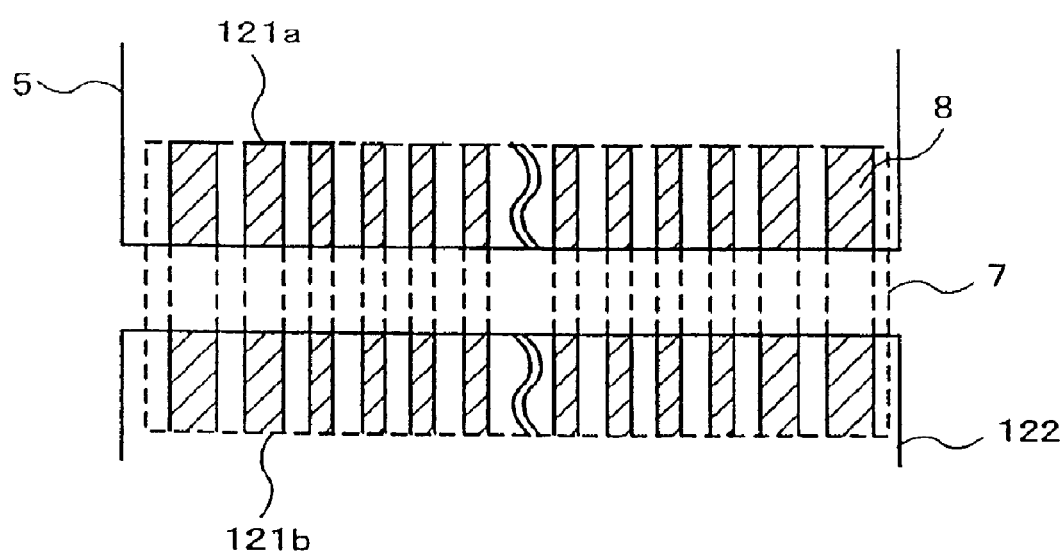
FIG. 3 is a plan view showing another conventional display device.

In addition, with the present exemplary embodiment, by varying the terminal pitches of the respective terminals so as to be non-uniform, the wiring path from driver IC 1 to flexible substrate 7 can be simplified. This is applicable not only to power supply wiring but also to signal wiring, as demonstrated by, for example, wiring 2 shown in FIG. 1 disposed in a bent state which is in contrast to wiring 2 shown in FIG. 4 disposed linearly (note that the wirings are simplistically depicted for convenience). Furthermore, this also enables the wiring path to be minimized to reduce wiring resistance.

Although the present exemplary embodiment described above is arranged so that an ITO film is formed on the pad surface, the present invention is not limited to this arrangement. Even when an ITO film is not formed and oxidation of terminal surfaces of the pressure-bonded section or the like may potentially increase contact resistance, the same effects can be achieved by applying the present invention.

In addition, while the width of the wiring connected to a charge pump has been described for the present exemplary embodiment, alternatively, the wiring width of, for example, the wiring through which a relatively large current flows can be widened.

Furthermore, with the present exemplary embodiment, while FPC mounting pad 4 electrically connected to connection wiring 3 leading to the driver built-in power supply and a terminal pair of terminals 6 are provided with approximately the same terminal widths, the terminal widths need not necessarily be the same. For example, one of the terminals may be divided by a slit or the like.

With the present exemplary embodiment, a large terminal area may cause a reduction of pressure of the pressure-bonded section during pressure bonding. In addition, a large area ratio with respect to other terminals may cause an imbalance in pressure among terminals. Therefore, the areas of the respective terminals are favorably arranged so that necessary pressure can be obtained at each terminal in accordance with the thrust force of the pressure bonding apparatus.

Figure 7A:
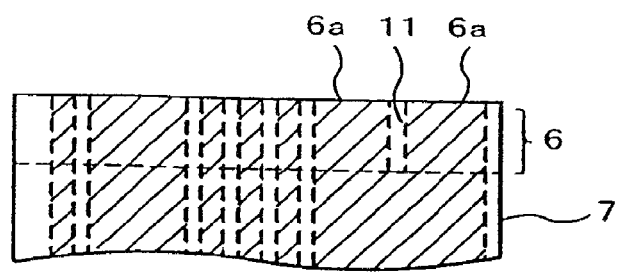
FIG. 7a is a plan view showing a display device according to a second exemplary embodiment.
Figure 7B:
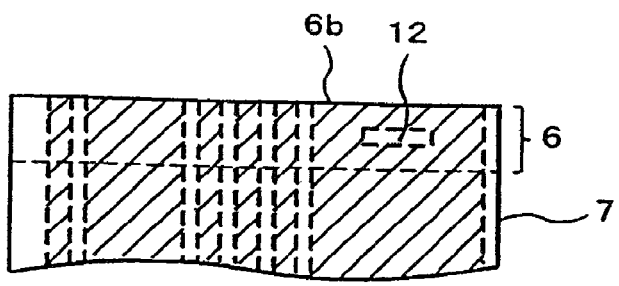
FIG. 7b is another plan view showing a display device according to the second exemplary embodiment.

Next, a second exemplary embodiment will be described with reference to FIGS. 7a and 7b. FIGS. 7a and 7b are diagrams showing a FPC of a display device according to the present second exemplary embodiment.

As shown in FIG. 7a, in the display device according to the present exemplary embodiment, slit 11 is provided on terminal 6a among a plurality of terminals 6 formed on FPC 7. While slit 11 can take any position, the slit is favorably positioned near the center of the terminals. It should be noted that while FPC 7 is pressure-bonded on the side of display panel 5 via anisotropically conductive tape 9 in the same manner as the first exemplary embodiment, components other than FPC 7 have been omitted from FIGS. 7a and 7b. In addition, as shown in FIG. 7b, the slit may be provided in the form of window aperture 12.

Figure 8A:
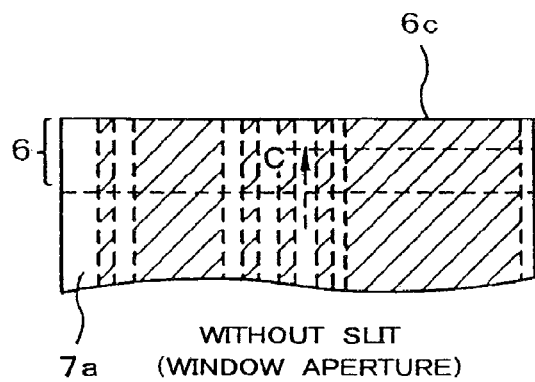
FIG. 8a is a plan view showing a terminal section of a flexible substrate not including a slit or a window aperture.
Figure 8C:
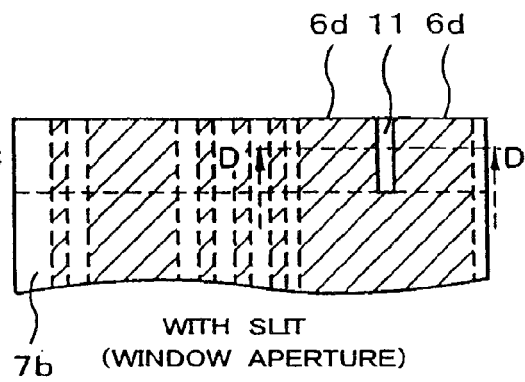
FIG. 8c is a plan view showing a terminal section of a flexible substrate including a slit.
Figure 8B:
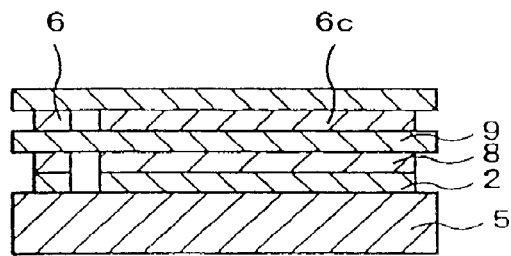
Figure 8D:
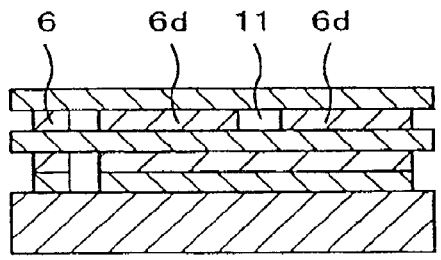
FIG. 8d is a cross-sectional diagram taken along line D-D of FIG. 8c.

Next, operations of the present exemplary embodiment will be described with reference to FIGS. 8a to 8d. FIG. 8a is a plan view showing a terminal section of FPC 7a not including a slit or a window aperture, and FIG. 8b is a cross-sectional diagram taken along line C-C of FIG. 8a. In addition, FIG. 8c is a plan view showing a terminal section of a FPC according to the present exemplary embodiment, and FIG. 8d is a cross-sectional diagram taken along line D-D of FIG. 8c. Note that in FIGS. 8a and 8c, components other than FPC 7 have been omitted for simplicity.

As shown in FIGS. 8a and 8b, the terminal section of FPC 7a does not include a list or a window aperture. In this case, the entire surface of terminal 6c is in contact with anisotropically conductive tape 9. Meanwhile, as shown in FIG. 8c, in the display device according to the present exemplary embodiment, slit 11 is provided on a portion of terminal 6d of FPC 7b. Pressure bonding onto display panel 5 using FPC 7b results in a state shown in FIG. 8d. In other words, by providing slit 11, the contact area between terminal 6d and its counterpart decreases. Therefore, providing the slit increases pressure on the terminals when pressure bonding is performed under the same force. As a result, a reduction of pressure on the terminal section during pressure bonding can be suppressed.

The above effect will now be described using a more specific example. For example, in FIG. 8a, assume that the area of terminal 6c among the plurality of terminals 6 is S1. Terminal 6c is not provided with a slit. In addition, in FIG. 5c, assume that the area of terminal 6*d* provided with a slit corresponding to 10% of terminal area S1 is S2. From the above, area S2 of terminal 6*d* according to the present exemplary embodiment is determined to be 0.9×S1. Consequently, when terminals 6*c* and 6*d* are pressure bonded using thrust force F, pressure P1 applied to terminal 6*c* without a slit is determined to be P1=F/S1. In addition, pressure P2 applied to terminal 6*d* provided with a slit is determined to be P2=F/(0.9×S1). From the above, according to the present exemplary embodiment, by providing a slit, for instance, a pressure-increasing effect of 10% is achieved in the example described above, enabling pressure bonding to be performed under more stable conditions.

With the first exemplary embodiment described earlier, the terminal area is increased by effectively utilizing the terminal region. By combining the first exemplary embodiment with the present exemplary embodiment and suitably providing slits while securing an outside dimension of the terminal section that is as large as possible, a reduction in pressure of the pressure-bonded section can be suppressed. In this sense, it is also favorable to provide window aperture 12 shown in FIG. 7*b* in addition to slit 11 shown in FIG. 7*a*. In addition, the slit need not be deep enough to divide the terminals of the pressure-bonded section as shown in FIG. 7*a*. In other words, a slit may also be configured so that a depression is provided on a peripheral section of a single terminal pressure-bonded surface.

While a preferred embodiment of the present invention has been described using specific terms, such description is for illustrative purposed only, and it is to be understood that changes and variations may be made without departing from the spirit or scope of the following claims.

What is claimed is:

1. A display device comprising:
    a driver circuit mounted on a display panel with an anisotropically conductive tape therebetween, said display panel being made of a glass substrate; and
    a flexible printed circuit (FPC) board mounted on an FPC mounting pad with the anisotropically conductive tape therebetween, said FPC mounting pad being on the glass substrate;
    wherein the driver circuit and the flexible printed circuit board are electrically connected by wiring formed on the glass substrate,
    wherein a first terminal of the FPC mounting pad connected to the wiring is wider than other terminals of the FPC mounting pad connected to the wiring and a first terminal of the flexible printed circuit board is wider than other terminals of the flexible printed circuit board, and
    wherein, in the terminals of the FPC mounting pad and in the terminals of the flexible printed circuit board, a terminal interval of at least one pair of adjacent terminals differs from other terminal intervals.

2. The display device according to claim 1, wherein the driver circuit includes a built-in charge pump direct current/direct current converter, and wherein the first terminals of the FPC mounting pad and of the flexible printed circuit board are electrically connected to the built-in charge pump direct current/direct current converter.

3. The display device according to claim 2, wherein the first terminals electrically connected to the built-in charge pump direct current/direct current converter are arranged with terminal widths such that a contact resistance of a pressure-bonded section is equal to or lower than a predetermined value.

4. The display device according to claim 1, further comprising a transparent conductive film on a pressure-bonded surface of each of the terminals of the FPC mounting pad.

5. The display device according to claim 1, wherein a slit or a window aperture is formed on a pressure-bonded surface of one or more of the terminals of the FPC mounting pad and the flexible printed circuit board.

6. The display device according to claim 2, further comprising a transparent conductive film on a pressure-bonded surface of each of the terminals of the FPC mounting pad.

7. The display device according to claim 3, further comprising a transparent conductive film on a pressure-bonded surface of each of the terminals of the FPC mounting pad.

8. The display device according to claim 2, wherein a slit or a window aperture is formed on a pressure-bonded surface of one or more of the terminals of the FPC mounting pad and the flexible printed circuit board.

9. The display device according to claim 3, wherein a slit or a window aperture is formed on a pressure-bonded surface of one or more of the terminals of the FPC mounting pad and the flexible printed circuit board.

10. The display device according to claim 4, wherein a slit or a window aperture is formed on a pressure-bonded surface of one or more of the terminals of the FPC mounting pad and the flexible printed circuit board.

11. The display device according to claim 1, wherein the first terminal of the FPC mounting pad and the first terminal of the flexible printed circuit board have the same width.

* * * * *